Feb. 10, 1959 J. ZAWELS 2,873,367

ANGLE MODULATION DETECTOR

Filed Nov. 19, 1953

INVENTOR.
Jakob Zawels

BY H. L. Newton
ATTORNEY

United States Patent Office 2,873,367

Patented Feb. 10, 1959

2,873,367

ANGLE MODULATION DETECTOR

Jakob Zawels, Capetown, Cape of Good Hope, Union of South Africa, assignor to Radio Corporation of America, a corporation of Delaware Application November 19, 1953, Serial No. 393,147

8 Claims. (Cl. 250—31)

Figure 1:
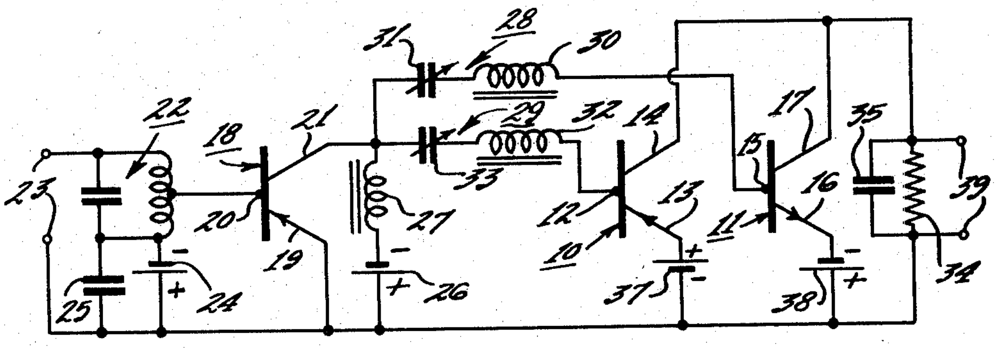

The present invention relates generally to detectors of angle modulated carrier waves and more particularly to circuits utilizing semi-conductor devices for deriving the modulation from a frequency modulated or phase modulated carrier wave.

By angle modulation it is meant either frequency modulation, phase modulation or hybrid forms of modulation possessing characteristics common to both of them.

In the past there have been provided various methods of detecting angle modulated carrier waves. Among these was the utilization of crystal diodes which were small in size, required low power consumption and contributed only to a small extent to the overall noise in the circuit. However, crystal diodes could not be utilized to provide amplification concurrently with detection.

Electron discharge devices on the other hand have been used to provide detection and amplification at the same time. However, such devices were large in size, consumed considerable power and added appreciably to circuit noise.

Another problem encountered in the utilization of electron discharge devices is the problem of coupling. In view of the fact that electron discharge devices are of only one conductivity type, single-ended coupling cannot be provided in a balanced arrangement without resort to transformers or phase inverters to provide a balanced input signal.

It is, of course, possible with appropriate circuit modifications to utilize semi-conductor devices such as transistors in the conventional types of angle modulation detector circuits above discussed. However, as in the case of the utilization of electron discharge devices, it is found that certain coupling problems are encountered.

Furthermore, in many applications it may be found desirable to use signal amplifier circuits employing the complementary symmetry principle. Accordingly it becomes highly desirable that the remaining circuits which are utilized in the receiving system take advantage of the complementary symmetry principle due to the great simplification of coupling arising therefrom.

Accordingly it is an object of the present invention to provide a simple detector of angle modulated carrier waves utilizing a pair of semi-conductor devices of opposite conductivity type.

It is another object of the present invention to provide a simple detector of angle modulated carrier waves utilizing a pair of semi-conductor devices of opposite conductivity type which requires a minimum of components to provide efficient coupling with other stages and which improves the operation of frequency modulation receiving systems.

It is a still further object of the present invention to provide a frequency modulation or other angle modulation detector circuit utilizing a pair of semi-conductor devices of opposite conductivity type to concurrently provide both detection and amplification.

In accordance with the present invention a pair of semi-conductor devices of opposite conductivity type are arranged for series operation for direct currents and for parallel operation for alternating currents. A frequency modulated signal carrier wave is applied simultaneously between the respective input electrodes of the semi-conductor devices in parallel through a pair of series resonant tuned circuits, one being tuned to a frequency below the carrier wave center frequency, the other being tuned to a frequency above the carrier wave center frequency. A common output circuit is provided between the output electrodes of the pair of semi-conductor devices and a point of fixed reference potential. Accordingly, there is developed across the output circuit a signal wave representing an amplified version of the carrier wave modulation signal.

Figure 2:
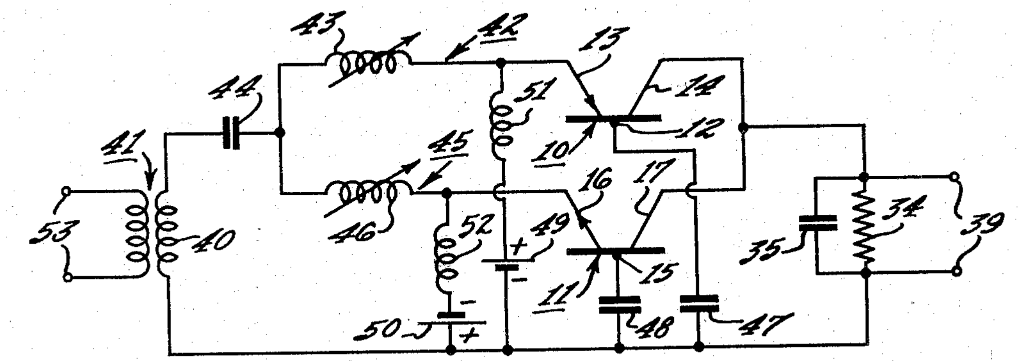

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a semi-conductor angle modulation detector circuit illustrating one embodiment of the present invention; and Figure 2 is a schematic circuit diagram of a semi-conductor angle modulation detector circuit illustrating a further embodiment of the present invention.

Referring now to the drawing wherein like reference characters are used to designate like elements throughout the several figures, and particularly to Figure 1, a pair of semi-conductor devices which are illustrated as transistors 10 and 11 of opposite conductivity type are provided in symmetrical arrangement as an angle modulation detector. The transistor 10 comprises a semi-conductive body which may be of either conductivity type but in Figure 1 is assumed to be the P-N-P type and further includes a base electrode 12, an emitter electrode 13, and a collector electrode 14. The transistor 11 also comprises a semi-conductive body which may be of either conductivity type but which must be of a conductivity type opposite to that semi-conductive body of the transistor 10. Accordingly, it is assumed to be of the N-P-N type and further includes a base electrode 15, an emitter electrode 16, and a collector electrode 17.

Input signals from a source of frequency modulated carrier wave energy such as from an intermediate frequency signal amplifier stage of a frequency modulation receiving system, may be applied to the input electrodes of the semi-conductor devices.

Accordingly a transistor 18 comprising an emitter electrode 19, a base electrode 20 and a collector electrode 21 may be connected as an intermediate frequency signal amplifier stage wherein a parallel resonant tuned circuit 22 tuned to the intermediate frequency of the receiving system is coupled between a pair of input terminals 23 and the base electrode 20. Operating bias for the transistor 18 may be provided by means of a first bias battery 24 connected between one end of the parallel resonant tuned circuit 22 and a point of fixed reference potential such as ground. The battery 24 may be bypassed for signal frequencies. A second battery 26 which is connected in the proper polarity to provide a reverse bias between the collector electrode 21 and the base electrode 20 is connected between ground and the collector electrode 21 through a radio frequency choke 27.

The output signal which is developed in the collector electrode circuit of the transistor 18 may be applied to the input electrodes of the modulator circuit by connecting the collector electrode 21 to the junction of a pair of series resonant circuits 28 and 29.

The first of the pair of series resonant circuits 28 comprises an inductor 30 and a variable capacitor 31 connected in series between the base electrode 15 and the collector electrode 21. It is noted that this first series resonant circuit may be tuned to a frequency which is higher than the center frequency of the frequency modulated carrier wave. The second tuned circuit comprises an inductor 32 and a variable capacitor 33 connected in series between the base electrode 12 and the collector electrode 21. It is noted at this time that this second series resonant tuned circuit is tuned to a frequency which is below the center frequency of the frequency modulated carrier wave.

The output signal energy of the angle modulation detector circuit is developed across a load circuit including a load impedance element illustrated as a resistor 34 connected between the collector electrodes 14 and 17 and ground, and which may be bypassed for a signal of the carrier wave frequency by a capacitor 35. A pair of output terminals 39 are provided, one of which is connected to the collector electrodes 14 and 17, the other of which may be connected to ground.

Energizing potentials may be provided from any convenient source, which by way of illustration is shown as a pair of batteries 37 and 38 connected respectively between the emitter electrode 13 and ground and the emitter electrode 16 and ground. It is noted that each of the two batteries 37 and 38 is poled in such a direction as to apply the correct bias potentials between the electrodes of the semi-conductor devices 10 and 11. If the conductivity type of transistors 10 and 11 were to be changed to be opposite to that illustrated, the polarity of the batteries would have to be reversed.

Under static operating conditions, that is, without an input signal being applied to the input terminals 23, a static direct current will flow from the positive terminal of the battery 37 into the emitter electrode 13, out of the collector electrode 14, into the collector electrode 17 and out of the emitter electrode 16, to the negative terminal of the battery 38. If the current flowing out of the collector electrode 14 is different from the current of the collector electrode 17, the differential current will have to flow through the load resistor 34 to the battery. However, it is preferred that the transistors 10 and 11 be balanced so that the differential current of the collector electrodes is substantially zero.

Accordingly, if a frequency modulated carrier wave is applied to the input terminals 23 and it is assumed for the purpose of discussion that instantaneously the carrier wave frequency has shifted to a frequency above that of the center frequency, it is readily seen that an input signal will be applied between the emitter electrode 16 and the base electrode 15 by means of the first series resonant circuit 28. This will, of course, produce an increase in the current flowing into the collector electrode 17. This increase in current flow represents a differential signal current which will flow through the load resistor 34 providing an output signal voltage thereacross. If on the other hand, the carrier wave frequency has shifted to a frequency below the center frequency, an input signal will be applied through the second series resonant circuit between the emitter electrodes 13 and the base electrode 12 producing in the output circuit of the transistor 10 an increased collector electrode current. This differential or signal current as above discussed will flow through the load resistor 34 producing again thereacross an output signal voltage. It is noted that the polarity of the signal voltage produced across the load resistor 34 by the current flowing out of the collector electrode 14 is in phase opposition to the signal voltage developed across the load resistor 34 by the current flowing into the collector electrode 17. Accordingly, there is developed across the load resistor 34 a signal which is representative of the modulation signal of the carrier wave.

It is noted that as illustrated in Figure 1, there is no direct current return for the base electrodes 12 and 15. When utilizing particular transistors it may be necessary for optimum operation and balancing of the circuit that a direct current path be provided for these electrodes. Accordingly, a radio frequency choke coil may be connected in shunt with each of the two variable capacitors 31 and 33 and further, if desired, additional bias may be provided in this circuit.

It is readily seen, therefore, that in accordance with the invention there is provided a simple, stable, angle modulation detector circuit utilizing a minimum of circuit elements and providing an output with all of its inherent advantages.

The schematic circuit diagram of the angle modulation detector circuit illustrated in Figure 2 is a modification of that shown in Figure 1 in that the emitter electrodes 13 and 16 are the ungrounded input electrodes. Accordingly a secondary winding 40 of an input transformer 41 is connected in series with a first series resonant tuned circuit 42 between the emitter electrode 13 and ground, and a second series resonant tuned circuit 45 is connected between the unground terminal of the secondary winding 40 and the emitter electrode 16.

The first series resonant tuned circuit 42 comprises a variable inductor 43 and a capacitor 44 which are series resonant at a frequency above the center frequency of the carrier wave and the second series resonant tuned circuit 45 comprises a variable inductor 46 and the capacitor 44 which are series resonant at a frequency below the center frequency of the carrier wave.

Output signals presenting an amplified variation of the modulation wave are developed across a load circuit comprising a load impedance element illustrated as a resistor 34 which may be bypassed at the carrier wave signal frequency by a capacitor 35. A pair of output terminals 39 is provided, one of which is connected to the collector electrodes 14 and 17, the other of which may be connected to ground.

The alternating current circuit of the transistors 10 and 11 is completed by the alternating current grounding capacitors 47 and 48 connected respectively between the base electrodes 12 and 15 and ground.

Bias for the transistors 10 and 11 may be provided from many convenient sources of direct current voltage which is illustrated as a pair of batteries 49 and 50. The negative terminal of the battery 49 and positive terminal of battery 50 are connected to ground. The positive terminal of the battery 49 is connected to the emitter electrode 13 through a radio frequency choke coil 51 and the negative terminal of the battery 50 is connected to the emitter electrode 16 through a radio frequency choke coil 52.

It is, of course, understood that the circuit as above described requires that the base electrode-emitter electrode circuits of the two transistors 10 and 11 will operate with essentially zero static bias. In view of the fact that the transistors 10 and 11 are being utilized as non-linear devices, a zero static bias in the input electrode will normally provide satisfactory operation. However, in the event that it is necessary to provide either a forward or a reverse bias between the respective input electrode of these devices, this may be readily accomplished by utilizing additional batteries or circuits as is well known to those skilled in the semi-conductor art.

It may now be readily seen that if a modulated carrier wave is applied to the input terminal 53 and it is assumed that the frequency of the carrier wave is instantaneously above the center frequency of the carrier wave, an input signal will be applied between the emitter electrode 13 and the base electrode 12 by means of the first series resonant tuned circuit. Such an application of an input signal will cause the collector electrode current of the transistor 10 to increase. This increased current will flow out of the collector electrode 14 through the load resistor 34, to the battery 49 thereby developing a signal voltage across the load resistor 34 having an instantaneous positive potential at the collector electrode 14. If, on the other hand, the carrier wave frequency is instantaneously below the center frequency, an input signal will be applied between emitted electrode 16 and the base electrode 15. This will cause an increase in the collector electrode current of the transistor 11. In view of the fact that the collector electrode current of the transistor 11 flows into the collector electrode 17, the signal voltage which will be developed across load resistor 34 will be of a polarity opposite to the signal voltage developed by the collector electrode current flowing out of the transistor 10. It is thus readily seen that variation in the frequency of an applied frequency modulated carrier wave will produce in the output circuit a signal voltage which is representative of the modulation wave.

It is, therefore, readily seen that the output signal is developed essentially in push-pull and accordingly all of the advantages of push-pull operation obtained.

It is, therefore, seen that an angle modulation detector circuit, as provided in accordance with the present invention, enables efficient operation to demodulate a carrier wave which has been modulated in frequency or phase with a minimum of circuit elements. Accordingly, signal amplification is realized concurrently with signal detection, and further, efficient single-ended coupling can be had with other stages of a receiving system without resort to phase inverters or transformers with all of their attendent disadvantages.

What is claimed is:

1. An angle modulation detector for deriving from angle modulated signal waves output voltages having a relative magnitude dependent upon the angular modulation of said waves and comprising in combination; a pair of semi-conductor devices of opposite conductivity type each including base, collector and emitter electrodes one of said base and emitter electrodes of each of said transistors being connected to signal ground; a signal wave input circuit referenced with respect to said signal ground; circuit means connected between a common ungrounded point in said input circuit and each one of the ungrounded one of said base and emitter electrodes and providing a series resonant circuit therebetween; and an output circuit across which said voltages are developed connected in common between said collector electrodes and said signal ground.

2. An angle modulation detector circuit, comprising in combination, a pair of semi-conductor devices of opposite conductivity type each including input, output and common electrodes, an input circuit upon which is impressed angle modulated carrier waves, a first frequency discriminating network connected between said input circuit and the input electrode of one of said pair of semi-conductor devices, a second frequency discriminating network connected between said input circuit and the input electrode of the second of said pair of semi-conductor devices, and an output circuit including an output impedance element connected between said output electrodes and said common electrodes across which is developed output voltages having a relative magnitude dependent upon the angular modulation of the said waves.

3. In an angle modulation detector circuit, the combination as defined in claim 2 wherein said first and said second frequency discriminating networks each comprise a series resonant circuit.

4. An angle modulation detector circuit, as defined in claim 2, wherein said first frequency discriminating network comprises a series resonant tuned circuit including a capacitor and an inductor and said second frequency discriminating network comprises a second series resonant tuned circuit including said capacitor and a second inductor.

5. An angle modulation detector, comprising in combination, a pair of semi-conductor devices of opposite conductivity type each including base, collector and emitter electrodes, means for connecting said emitter electrodes to a point of reference potential for said detector, an input circuit upon which is impressed modulated carrier waves, a first frequency discriminating network including a series resonant circuit connected between said input circuit and the base electrode of one of said pair of semi-conductor devices, a second frequency discriminating network including a second series resonant circuit referenced to said point of reference potential connected between said input circuit and the base electrode of the second of said pair of semi-conductor devices, and an output circuit including an output impedance element connected in common between said collector electrodes and said emitter electrodes across which is developed output voltages having a relative magnitude dependent upon the angular modulation of the said waves.

6. In an angle modulation signal receiving system, a detector for frequency modulated waves comprising a discriminator network for deriving from frequency modulated waves voltages whose relative magnitudes are dependent upon the frequency modulation of said waves; a pair of semi-conductor devices of opposite conductivity type each including input, output and common electrodes; means for connecting said common electrodes to a signal ground for said system; an input circuit referenced to said signal ground upon which said frequency modulated waves are impressed; a first frequency discriminating network coupled between said input circuit and the input electrode of one of said pair of semi-conductor devices for impressing an input signal thereon when said frequency modulated waves are characterized by a predetermined frequency deviation; a second frequency discriminating network coupled between said input circuit and the input electrode of the other of said pair of semi-conductor devices for impressing said frequency modulated waves thereon when said frequency modulated waves are characterized by a predetermined frequency deviation of opposite sense; an output circuit coupled in common between said output electrodes and said common electrodes whereby said first frequency discriminating network and said one of said pair of semi-conductor devices causes current to flow therethrough in one direction and said second frequency discriminating network and said other of said pair of said semi-conducting devices causes current to flow therethrough in the opposite direction.

7. In an angle modulation signal receiving system, a detector as defined in claim 6, wherein said first and said second frequency discriminating networks each comprise a series resonant circuit.

8. In an angle modulation signal receiving system, a detector as defined in claim 6, wherein said first frequency discriminating network comprises a series resonant tuned circuit including a capacitor and an inductor and said second frequency discriminating network includes said capacitor and a second inductor.

References Cited in the file of this patent

UNITED STATES PATENTS

| | | |
|---|---|---|
| 2,165,252 | Goldstine | July 11, 1939 |
| 2,280,569 | Crosby | Apr. 21, 1942 |
| 2,286,378 | Roberts | June 16, 1942 |
| 2,361,625 | Hansell | Oct. 31, 1944 |
| 2,373,616 | Sziklai | Apr. 10, 1945 |
| 2,410,275 | Eilenberger | Oct. 29, 1946 |
| 2,457,013 | Usselman | Dec. 21, 1948 |
| 2,620,448 | Wallace | Dec. 2, 1952 |
| 2,663,796 | Raisbeck et al. | Dec. 22, 1953 |
| 2,666,819 | Raisbeck | Jan. 19, 1956 |